US010411470B2

(12) United States Patent
An et al.

(10) Patent No.: US 10,411,470 B2
(45) Date of Patent: Sep. 10, 2019

(54) LARGE CAPACITY BATTERY SYSTEM FOR POWER SYSTEM FREQUENCY REGULATION AND LARGE CAPACITY BATTERY OPERATION METHOD

(71) Applicant: HYOSUNG HEAVY INDUSTRIES CORPORATION, Seoul (KR)

(72) Inventors: Geon Ho An, Incheon (KR); In Sun Choi, Gunpo-si (KR); Myong Hoe Kim, Seoul (KR); Dong Jun Won, Incheon (KR); Jin Young Choi, Bucheon-si (KR); Jin Sun Yang, Bucheon-si (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 45 days.

(21) Appl. No.: 15/738,568

(22) PCT Filed: Jun. 23, 2016

(86) PCT No.: PCT/KR2016/006657
§ 371 (c)(1),
(2) Date: Dec. 20, 2017

(87) PCT Pub. No.: WO2016/208974
PCT Pub. Date: Dec. 29, 2016

(65) Prior Publication Data
US 2018/0191161 A1   Jul. 5, 2018

(30) Foreign Application Priority Data

Jun. 23, 2015 (KR) .................. 10-2015-0089236

(51) Int. Cl.
*H02J 3/32* (2006.01)
*G01R 31/382* (2019.01)
(Continued)

(52) U.S. Cl.
CPC .............. *H02J 3/32* (2013.01); *G01R 31/382* (2019.01); *G05B 13/048* (2013.01); *G05F 1/67* (2013.01);
(Continued)

(58) Field of Classification Search
CPC ......... H02J 3/32; G05B 13/048; G06Q 50/06; G05F 1/67
See application file for complete search history.

(56) References Cited

U.S. PATENT DOCUMENTS 9,692,243 B2 *  6/2017  Kaji .......................... H02J 3/32
2010/0090532 A1 *  4/2010  Shelton ..................... H02J 3/32
                                                                    307/46
(Continued)

FOREIGN PATENT DOCUMENTS

| KR | 10-2013-0035758 A | 4/2013 |
| KR | 10-1477648 B1 | 12/2014 |
| KR | 10-1493785 B1 | 2/2015 |
| KR | 10-2015-0067860 A | 6/2015 |
| KR | 10-1529294 B1 | 6/2015 |

OTHER PUBLICATIONS

International Search Report in International Application No. PCT/KR2016/006657 dated Sep. 21, 2016.

*Primary Examiner* — Vincent H Tran
(74) *Attorney, Agent, or Firm* — Novick, Kim & Lee, PLLC; Jae Youn Kim (57) ABSTRACT

A large capacity battery system for managing a large capacity battery used for power system frequency regulation and a large capacity battery operation method are provided. The method may include the steps of: calculating an estimated frequency regulation signal for the next day using history information of past frequency regulation signals; calculating a bidding capacity and a basic value for the large capacity battery, matched to the estimated frequency regulation signal; and determining an operation plan using the calculated bidding capacity and basic value; bidding the bidding capac- (Continued)

ity and basic value for the large capacity battery according to the operation plan on the day-ahead frequency regulation market.

19 Claims, 7 Drawing Sheets

(51) Int. Cl.
- G06Q 50/06 (2012.01)
- G05B 13/04 (2006.01)
- G05F 1/67 (2006.01)
- H01M 10/44 (2006.01)
- H02J 7/00 (2006.01)
- G06Q 30/08 (2012.01)

(52) U.S. Cl.
CPC ............ *G06Q 30/08* (2013.01); *G06Q 50/06* (2013.01); *H01M 10/441* (2013.01); *H02J 7/0068* (2013.01)

(56) References Cited

U.S. PATENT DOCUMENTS

| | | | |
|---|---|---|---|
| 2011/0285147 A1* | 11/2011 | Fyke | H02J 3/28 290/1 R |
| 2014/0039710 A1* | 2/2014 | Carter | G06Q 10/06 700/291 |
| 2014/0304025 A1* | 10/2014 | Steven | G06Q 10/06314 705/7.24 |
| 2015/0008884 A1* | 1/2015 | Waki | H02J 3/32 320/134 |
| 2015/0127425 A1* | 5/2015 | Greene | G06Q 30/0202 705/7.31 |
| 2015/0242946 A1* | 8/2015 | Powell | G06Q 30/08 705/26.3 |
| 2015/0261239 A1* | 9/2015 | Zhang | G06Q 30/08 700/291 |
| 2015/0268644 A1* | 9/2015 | Zhong | H02J 3/00 700/287 |

* cited by examiner

LARGE CAPACITY BATTERY SYSTEM FOR POWER SYSTEM FREQUENCY REGULATION AND LARGE CAPACITY BATTERY OPERATION METHOD

CROSS-REFERENCE TO RELATED APPLICATIONS

This application is the National Stage filing under 35 U.S.C. 371 of International Application No. PCT/KR2016/006657, filed on Jun. 23, 2016, which claims the benefit of Korean Patent Application No. 10-2015-0089236, filed on Jun. 23, 2015, the contents of which are all hereby incorporated by reference herein in their entirety.

TECHNICAL FIELD

The present invention relates to a large capacity battery system for managing a large capacity battery used in frequency regulation of a power grid system and a large capacity battery operation method.

BACKGROUND ART

As environmental destruction or exhaustion of resources becomes an issue, an interest in a system capable of storing electric power and efficiently utilizing the stored electric power is increasing. In addition, importance on renewable energy such as photovoltaic generation gradually increases. In particular, studies on applicability of renewable energy are being made in a variety of fields because it uses natural resources such as solar power, wind power, or tidal power that are supplied infinitely and does not generate pollution in the course of generation.

In general, in the field of the renewable energy system, a new energy source has been studied and developed, or conventional fossil energy has been converted efficiently in order to address problems such as an energy crunch or environmental pollution. For example, energy can be obtained by converting regenerable energy such as solar power, water power, terrestrial heat, and biological organisms or future energy sources for supplying sustainable energy. As such a renewable energy system, there are known a wind power system, a photovoltaic generation system, and the like.

According to the Korean reliability criteria, the power grid system is required to maintain a frequency of 60±0.2 Hz. Such a power grid system enforces a frequency control ancillary service for a frequency control pursuant to the reliability criteria. The frequency control ancillary service includes a frequency response ancillary service and a frequency regulation ancillary service, and there are also markets for each service. Therefore, generation resources are required to participate in the frequency response market or the frequency regulation market to provide the frequency control ancillary service.

An electricity market consists of a day-ahead market and a real-time market. The day-ahead market is a market opened one day ahead of operation, and the real-time market is a market opened additionally for unexpected reasons such as a system situation of the operation day. If a large-capacity battery bids for the frequency regulation market and conducts frequency regulation, it can guarantee high reliability with a fast response speed, and can provide fixed output power and maximum output power to conventional power generators whose output power is fluctuating in a power grid system. However, due to a capacity restriction in the large-capacity battery, the large-capacity battery is restricted in participation in the frequency regulation market.

As one of the battery charge/discharge techniques of the prior art, a technique of estimating a contract price in the electricity market has been proposed. Specifically, in this technique of the prior art, in order to increase a successful bidding possibility, a contractible price is predicted by checking a reserve margin of the electricity market or a history of the contract price, and this predicted price is applied to a bid.

However, this technique of the prior art merely focuses on a technique relating to a successful bid of the battery based on the contract price history and fails to discuss a battery operation method after the contract.

In addition, in state-of-charge (SOC) management of the battery, an optimum charging time is calculated on the basis of a result of the bidding for electricity generation in the distributor's side. Therefore, when a battery is used as a frequency regulation reserve whose signal changes in a real-timely manner, the battery SOC continuously decreases or increases, so that it may exceed a battery charge/discharge allowance level disadvantageously. Therefore, there is a demand for a system capable of more effectively and economically operating a battery and stably managing a battery SOC when the battery is used as a frequency regulation reserve.

SUMMARY OF THE INVENTION

Technical Problem

In view of the aforementioned problems, it is therefore an object of the invention to provide a technology for economically operating a large-capacity battery by bidding a bidding capacity and a basic value of the large-capacity battery participating in a frequency regulation market on the basis of a day-ahead operation schedule and managing a state of charge (SOC) of the large-capacity battery within a stable range.

In addition, the present invention provides a technology of recovering the SOC of the large-capacity battery by rebidding the bidding capacity and the basic value when the SOC of the large-capacity battery deviates from a stable range due to a signal based on a system situation of the operation day.

An object of the present invention is not limited to those described above, and a person skilled in the art would apparently appreciate other objects by reading the following description.

Technical Solution

According to an aspect of the present invention, there is provided a method of operating a large-capacity battery in a large-capacity battery system for managing the large-capacity battery used in frequency regulation of a power grid system, the method including: calculating an expected frequency regulation signal of the next day using history information on past frequency regulation signals; calculating a bidding capacity and a basic value of the large-capacity battery suitable for the expected frequency regulation signal; determining an operational schedule using the calculated bidding capacity and the calculated basic value; bidding the bidding capacity and the basic value of the large-capacity battery for a day-ahead frequency regulation market on the basis of the operational schedule; and receiving and storing the frequency regulation signal from a real-time frequency regulation market and operating the large-capacity battery on the basis of the received frequency regulation signal if the bidding of the bidding capacity and the basic value of the large-capacity battery for the day-ahead frequency regulation market is successful.

In the method described above, if a state of charge (SOC) of the large-capacity battery is within a range between a lower-limit SOC and an upper-limit SOC set in advance in the step of operating the large-capacity battery, the large-capacity battery may be operated using the bidding capacity and the basic value of the large-capacity battery calculated in a day-ahead operation schedule.

In the method described above, if the SOC of the large-capacity battery is not within the range between the lower-limit SOC and the upper-limit SOC set in advance in the step of operating the large-capacity battery, the bidding capacity and the basic value of the large-capacity battery may be recalculated and rebid for a real-time market.

In the method described above, if the SOC of the large-capacity battery decreases under the lower-limit SOC, the large-capacity battery system may set a charging state for charging the large-capacity battery, recalculate the bidding capacity and the basic value for charging the large-capacity battery, and rebid for the real-time market.

The method described above may further include: recalculating the bidding capacity and the basic value and rebidding for the real-time market to recover the SOC of the large-capacity battery until the SOC of the large-capacity battery in the charging state becomes a basic SOC set in advance; and returning to the normal state again and operating the large-capacity battery using the bidding capacity and the basic value of the large-capacity battery calculated in the day-ahead operation schedule if the SOC of the large-capacity battery is higher than the basic SOC.

In the method described above, if the SOC of the large-capacity battery increases over the upper-limit SOC, the large-capacity battery system may set a discharging state for discharging the large-capacity battery, recalculate the bidding capacity and the basic value for discharging the large-capacity battery, and rebid for the real-time market.

The method described above may further including: recalculating the bidding capacity and the basic value and rebidding for the real-time market to recover the SOC of the large-capacity battery until the SOC of the large-capacity battery of the discharging state becomes equal to the basic SOC; and returning to the normal state again and operating the large-capacity battery using the bidding capacity and the basic value of the large-capacity battery calculated in the day-ahead operation schedule if the SOC of the large-capacity battery becomes lower than the basic SOC.

In the method described above, a rebidding pre-notification time may change on the basis of a rule defined in each frequency regulation market when the bidding capacity and the basic value of the large-capacity battery are recalculated and are rebid for the real-time market.

In the method described above, the bidding capacity and the basic value may be calculated using an optimization method when the bidding capacity and the basic value of the large-capacity battery suitable for the expected frequency regulation signal are calculated.

According to another aspect of the invention, there is provided a large-capacity battery system for managing a large-capacity battery used in frequency regulation of a power grid system, including: an output control device provided with at least one large-capacity battery (or energy storage system, ESS) and configured to manage output power of the large-capacity battery; and an integrated management device configured to manage at least one output control device, receive an actual frequency regulation signal from a frequency regulation market, store a history of the frequency regulation signal, calculate an expected frequency regulation signal of the next day using history information on the past frequency regulation signal, calculate a bidding capacity and a basic value of the large-capacity battery suitable for the expected frequency regulation signal, determine an operational schedule using the calculated bidding capacity and the calculated basic value, bid the bidding capacity and the basic value of the large-capacity battery for a day-ahead frequency regulation market on the basis of the operational schedule, receive and store a frequency regulation signal from a real-time frequency regulation market if the bidding of the bidding capacity and the basic value of the large-capacity battery for the day-ahead frequency regulation market is successful, and operate the large-capacity battery on the basis of the received frequency regulation signal.

In the large-capacity battery operation system described above, the integrated management device may operate the large-capacity battery using the bidding capacity and the basic value of the large-capacity battery calculated in the day-ahead operation schedule if the SOC of the large-capacity battery is within a range between a lower-limit SOC and an upper-limit SOC set in advance.

In the large-capacity battery operation system described above, the integrated management device may recalculate the bidding capacity and the basic value of the large-capacity battery and rebid for a real-time market if the SOC of the large-capacity battery is not within the range between the lower-limit SOC and the upper-limit SOC set in advance.

In the large-capacity battery operation system described above, the integrated management device may set a charging state for charging the large-capacity battery, recalculates the bidding capacity and the basic value for charging the large-capacity battery, and rebid for the real-time market if the SOC of the large-capacity battery decreases under the lower-limit SOC.

In the large-capacity battery operation system described above, the integrated management device may recalculates the bidding capacity and the basic value and rebids for the real-time market to recover the SOC of the large-capacity battery until the SOC of the large-capacity battery of the charging state becomes a basic SOC set in advance, and the integrated management device may return to a normal state again and operate the large-capacity battery using the bidding capacity and the basic value of the large-capacity battery calculated in a day-ahead operational schedule if the SOC of the large-capacity battery is higher than the basic SOC.

In the large-capacity battery operation system described above, the integrated management device may set a discharging state for discharging the large-capacity battery, recalculate the bidding capacity and the basic value for discharging the large-capacity battery, and rebid for the real-time market if the SOC of he large-capacity battery increases over the upper-limit SOC.

In the large-capacity battery operation system described above, the integrated management device may recalculate the bidding capacity and the basic value and rebid for the real-time market to recover the SOC of the large-capacity battery until the SOC of the large-capacity battery of the discharging state becomes the basic SOC, and the integrated management device may return to the normal state again and operate the large-capacity battery using the bidding capacity and the basic value of the large-capacity battery calculated in the day-ahead operation schedule if the SOC of the large-capacity battery is lower than the basic SOC.

In the large-capacity battery operation system described above, a rebidding pre-notification time changes on the basis of a rule defined for each frequency regulation market when the bidding capacity and the basic value of the large-capacity battery are recalculated and are rebid for the real-time market.

In the large-capacity battery operation system described above, the bidding capacity and the basic value may be calculated using an optimization method.

In the large-capacity battery operation system described above, the integrated management device may have a database for storing the frequency regulation signal received from the real-time frequency regulation market.

Advantageous Effects

According to the present invention, the large-capacity battery system determines the bidding capacity and the basic value considering the SOC of the large-capacity battery and bids for the day-ahead market. Therefore, it is possible to stably operate the SOC of the large-capacity battery within a SOC range set in advance.

According to the present invention, the bidding capacity and the basic value are calculated, and the operational schedule is determined such that a maximum profit can be obtained using an optimization method of the integrated management device considering the SOC. Therefore, it is possible to allow an operator to obtain a maximum profit.

According to the present invention, it is possible to prevent the SOC from deviating from a restriction range due to a difference between the actual frequency regulation signal and the estimated frequency regulation signal at the operation day. Therefore, it is possible to stably manage the SOC of the large-capacity battery and allow an operator to maintain a maximum profit by complying with the day-ahead operation schedule.

According to the present invention, since the history of the actual frequency regulation signal is stored in the integrated management device, it is possible to improve accuracy in determination of the expected frequency regulation signal in the future.

DESCRIPTION OF EMBODIMENTS

Since the present invention may be modified or embodied in various forms, particular embodiments will be described in detail with reference to the accompanying drawings. However, it should be noted that they are not intended to limit the invention, but include all possible all possible modifications, equivalents, and substitutes within the scope and spirit of the present invention.

The terminologies used herein are only for the purpose of describing particular embodiments and are not intended to limit the invention. As used herein, the singular forms "a", "an" and "the" may be intended to include the plural forms as well, unless the context clearly indicates otherwise. It is further to be noted that, as used herein, the terms "comprises", "comprising", "include", and "including" indicate the presence of stated features, integers, steps, operations, units, and/or components, but do not preclude the presence or addition of one or more other features, integers, steps, operations, units, and/or components, and/or combination thereof.

Unless specified otherwise, all terminologies used herein, including technical and scientific terminologies, have the same meaning as those understood generally by a person skilled in art. Terminologies defined in a general dictionary are to be construed as the same meanings as those understood in the context of the related art. Unless specified clearly herein, they are not construed as ideal or excessively formal meanings.

It is noted that like reference numerals denote like elements throughout overall drawings. In addition, descriptions of well-known apparatus and methods may be omitted so as to not obscure the description of the representative embodiments, and such methods and apparatus are clearly within the scope and spirit of the present disclosure.

Figure 1:
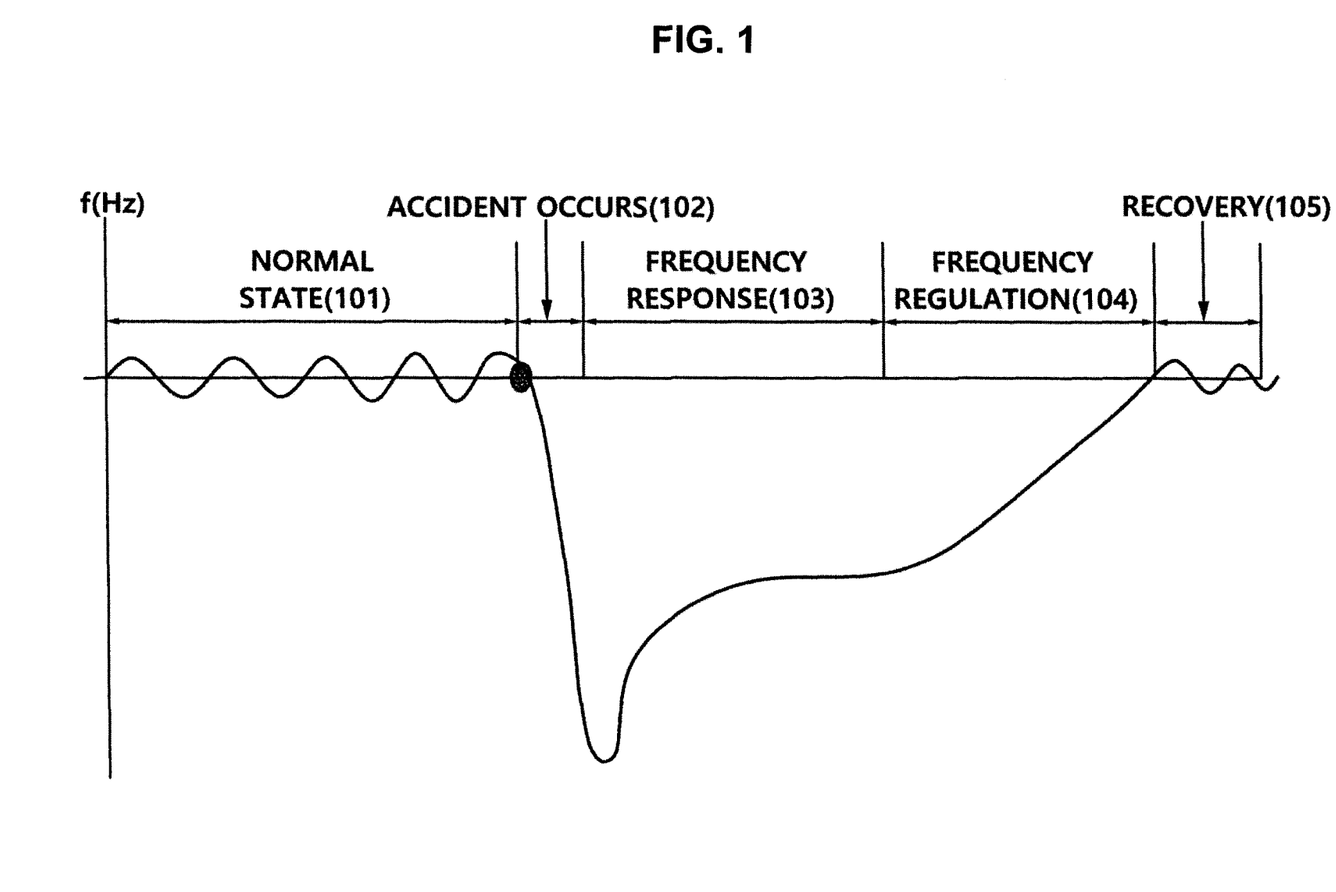
FIG. 1 is an exemplary graph illustrating frequency recovery in a frequency control ancillary service.

FIG. 1 is an exemplary graph illustrating frequency recovery in a frequency control ancillary service.

Referring to FIG. 1, a power grid system controls a frequency using an automatic generation control (AGC) based on a frequency regulation reserve applied to a bid for a frequency regulation market 104 and a governor free control (GFC) based on a frequency response reserve bid for a frequency response market 103 when the frequency is out of a dead band.

A frequency response section 103 is a control section based on a primary reserve. Its sustainable time is set to approximately twenty seconds at minimum, which is relatively short. However, in the frequency response section 103, a generation source capable of a fast response within ten seconds is employed, and a P-f droop control of a governor is applied.

A frequency regulation section 104 is a control section based on a secondary reserve. Its response speed is relatively slow. However, a generation source capable of maintaining the output power for a long time takes over the frequency regulation section 104. In addition, the frequency is recovered by regulating a power generation capacity of a generator driven at a rated output power or lower.

An accident such as a generator failure occurs at the timing 102 during a normal state 101, the frequency abruptly falls down, and the power grid system performs the GFC control based on a frequency response reserve in response to the falling frequency. Since the GFC control uses the P-f droop control, it fails to recover the frequency up to a power grid frequency specified in the reliability criteria. Therefore, the power grid system regulates the frequency using the AGC control based on the frequency regulation reserve after the GFC control (104). As the frequency is recovered as a result of the AGC control (105), the power grid system is operated again in a normal state (101). The present invention focuses on a part of the operation of the frequency regulation market corresponding to the AGC control.

In order to provide a frequency regulation ancillary service, the large-capacity battery system according to the present invention plans an economic bid by creating a day-ahead schedule on a bidding capacity and a basic value of the large-capacity battery applied to a bid for the frequency regulation market, stably manages the SOC, and provides a real-time SOC management method based on a system situation of the operation day.

Figure 2:
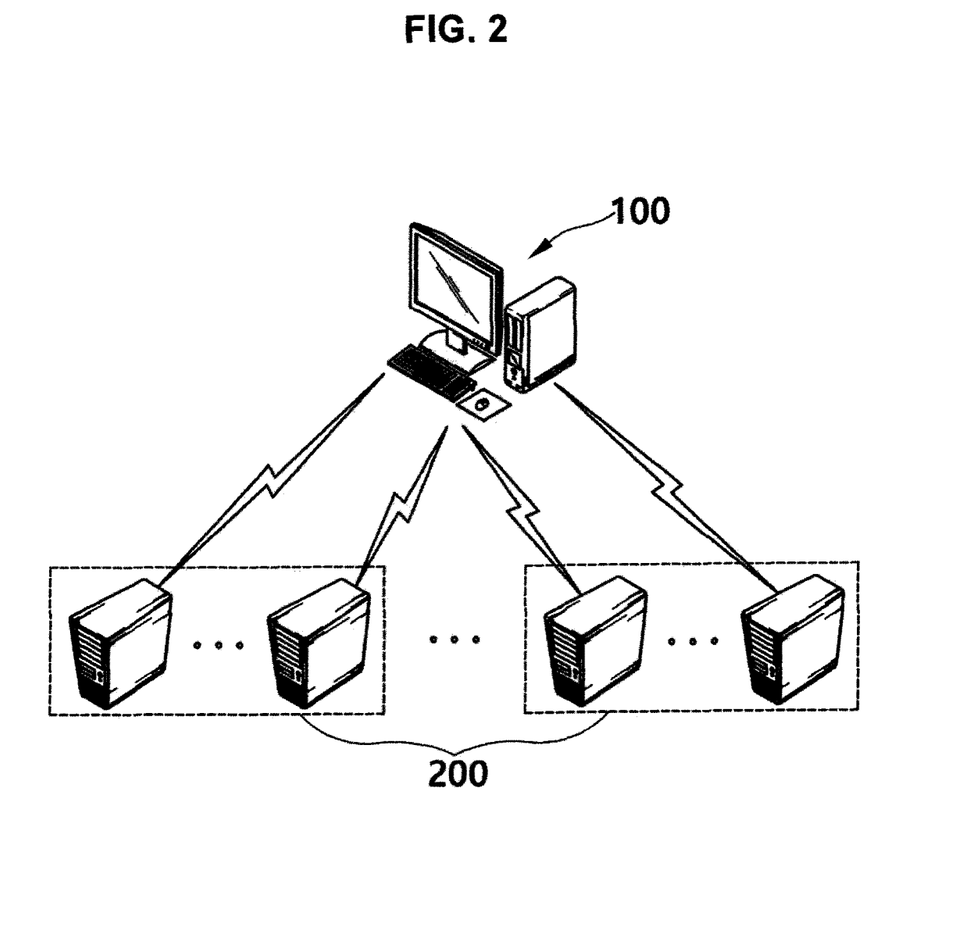
FIG. 2 is a schematic diagram illustrating a configuration of a large-capacity battery system according to an embodiment of the invention.

FIG. 2 is a schematic diagram illustrating a configuration of the large-capacity battery system according to an embodiment of the invention.

Referring to FIG. 2, the large-capacity battery system according to the invention has an output control device 200 and an integrated management device 100.

The output control device 200 has at least one large-capacity battery (energy storage system, ESS) and manages output power of the large-capacity battery.

The integrated management device 100 manages at least one output control device 200. The integrated management device 100 receives actual frequency regulation signals from the market, stores a history of the frequency regulation signals, and determines a day-ahead operation schedule and a real-time operational schedule considering the SOC of the large-capacity battery.

A bid for the frequency regulation market according to the present invention can be classified into a day-ahead market and a real-time market. The day-ahead market refers to a market in which a frequency regulation reserve to be used in the next day is traded on a time-zone basis.

The large-capacity battery system according to the present invention participates in the day-ahead market using the bidding capacity and the basic value.

The integrated management device 100 according to the present invention manages at least one output control device, receives actual frequency regulation signals from the frequency regulation market, stores a history of the frequency regulation signal, and calculates an expected frequency regulation signal of the next day using the history information of the past frequency regulation signal. In addition, the integrated management device 100 calculates the bidding capacity and the basic value of the large-capacity battery suitable for the expected frequency regulation signal and determines an operational schedule using the calculated bidding capacity and the calculated basic value. Furthermore, the integrated management device 100 bids the bidding capacity and the basic value of the large-capacity battery on the basis of the operational schedule for the day-ahead frequency regulation market, and receives and stores the frequency regulation signal from the real-time frequency regulation market when the bidding of the bidding capacity and the basic value of the large-capacity battery for the day-ahead frequency regulation market is successful. Then, the integrated management device 100 operates the large-capacity battery on the basis of the received frequency regulation signal.

If the SOC of the large-capacity battery is within a range between a predetermined lower-limit SOC $SOC_{lowerlimit}$ and a predetermined upper-limit SOC $SOC_{upperlimit}$, the integrated management device 100 operates the large-capacity battery using the bidding capacity and the basic value of the large-capacity battery calculated in the day-ahead operation schedule.

If the SOC of the large-capacity battery is not within a range between a predetermined lower-limit SOC $SOC_{lowerlimit}$ and a predetermined upper-limit SOC $SOC_{upperlimit}$, the integrated management device 100 recalculates the bidding capacity and the basic value of the large-capacity battery and rebids for the real-time market.

If the SOC of the large-capacity battery decreases under the lower-limit SOC $SOC_{lowerlimit}$, the integrated management device 100 sets a charging state for charging the large-capacity battery, recalculates the bidding capacity and the basic value for charging the large-capacity battery, and rebids for the real-time market.

Until the SOC of the large-capacity battery in the charging state becomes a predetermined basic SOC $SOC_{base}$, the integrated management device 100 recalculates the bidding capacity and the basic value, and rebids for the real-time market to recover the SOC of the large-capacity battery. If the SOC of the large-capacity battery exceeds the $SOC_{base}$, the integrated management device 100 is recovered to the normal state again, and operates the large-capacity battery using the bidding capacity and the basic value of the large-capacity battery calculated in the day-ahead operation schedule.

If the SOC of the large-capacity battery increases over $SOC_{upperlimit}$, the integrated management device 100 sets a discharging state for discharging the large-capacity battery, recalculates the bidding capacity and the basic value for discharging the large-capacity battery, and rebids for the real-time market.

Until the SOC of the large-capacity battery becomes the basic SOC $SOC_{base}$ in the discharging state, the integrated management device 100 recalculates the bidding capacity and the basic value, and rebids for the real-time market to recover the SOC of the large-capacity battery. When the SOC of the large-capacity battery becomes lower than $SOC_{base}$, the integrated management device 100 returns to the normal state again, and operates the large-capacity battery using the bidding capacity and the basic value of the large-capacity battery calculated in the day-ahead operation schedule.

When the integrated management device 100 recalculates the bidding capacity and the basic value of the large-capacity battery, and rebids for the real-time market, a rebidding pre-notification time may change depending on a rule defined in each frequency regulation market.

The integrated management device 100 may calculate the bidding capacity and the basic value using an optimization method.

The integrated management device 100 may have a database for storing the frequency regulation signals received from the real-time frequency regulation market.

Figure 4:
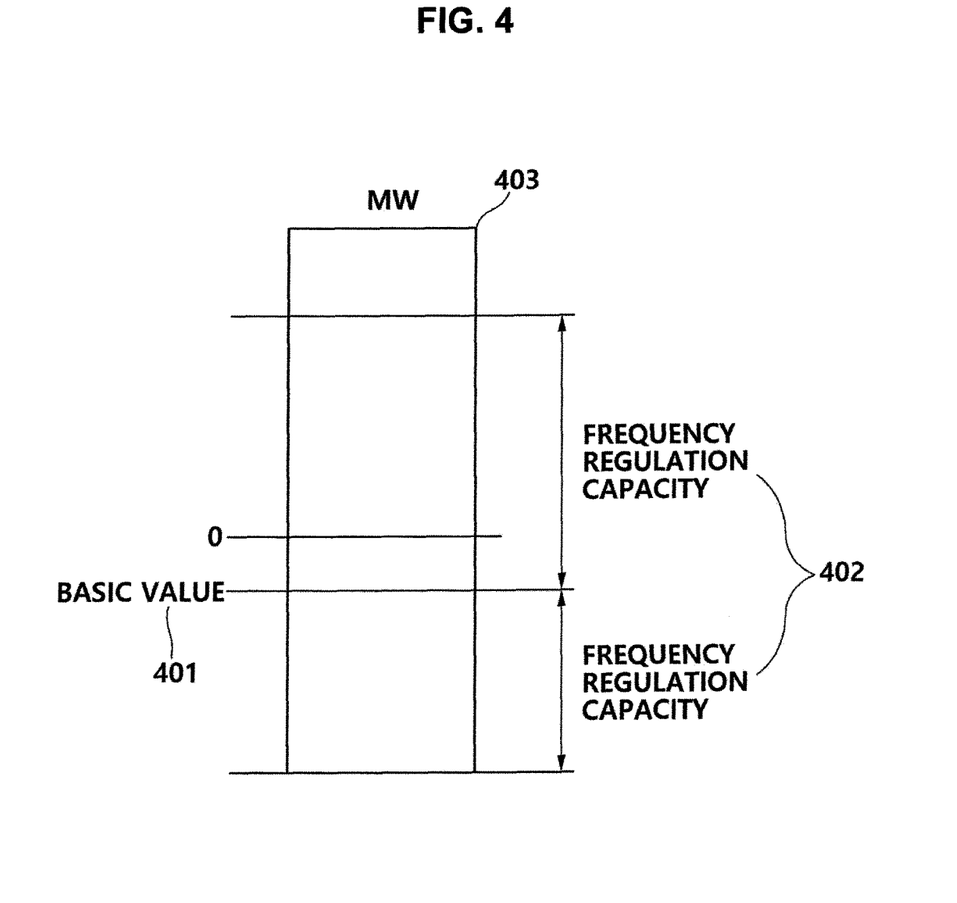
FIG. 4 is a schematic diagram illustrating a basic value and a bidding capacity of the large-capacity battery according to an embodiment of the invention.

FIG. 4 is a diagram illustrating the basic value and the bidding capacity of the large-capacity battery according to an embodiment of the invention.

In FIG. 4, the bidding capacity 402 refers to a capacity used when the large-capacity battery bids for the day-ahead market. When the bidding capacity is successful in the bidding, the large-capacity battery outputs power suitable for a dispatch command issued from the integrated management device depending on the bidding capacity.

The basic value 401 refers to an output power point at which the large-capacity battery is operated at all times. Basically, an initial basic value is set to zero, which indicates a state in which no charging or discharging operation is conducted. The large-capacity battery outputs only power suitable for the dispatch command on the basis of the basic value.

If the operation is performed by changing the basic value 401, the large-capacity battery outputs power corresponding to the basic value at all times. When the dispatch command is issued, the large-capacity battery additionally outputs power corresponding to the dispatch command on the basis of the basic value.

The bidding capacity 402 and the basic value 401 similarly apply to the real-time market.

Figure 3:
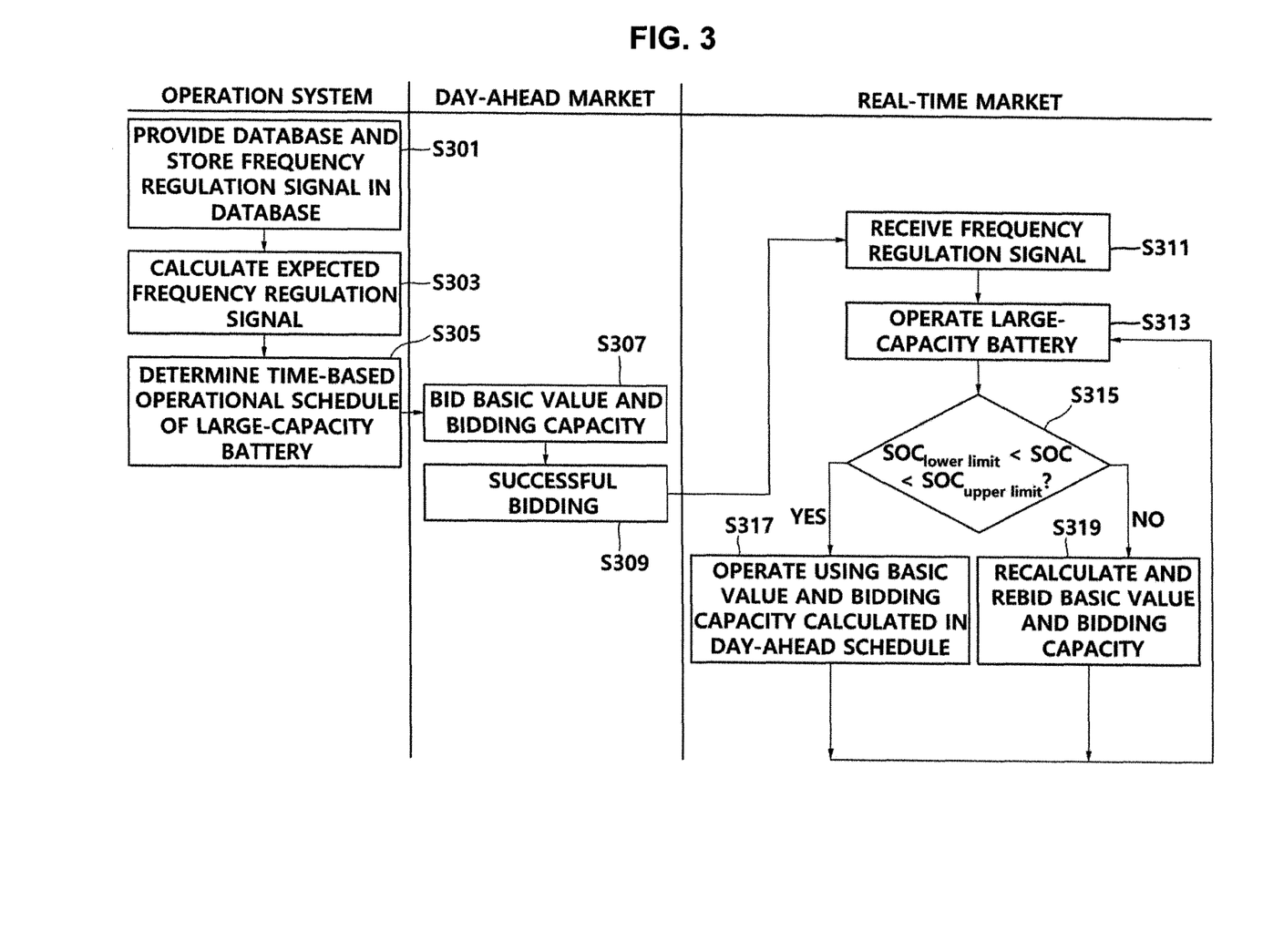
FIG. 3 is a flowchart illustrating a method of operating a large-capacity battery system according to an embodiment of the invention.

FIG. 3 is a flowchart illustrating a method of operating the large-capacity battery system according to an embodiment of the invention.

Referring to FIG. 3, the integrated management device 100 calculates the expected frequency regulation signal of the next day using a history of the past frequency regulation signals stored in the database of the integrated management device 100 (S301) and weather information (S303).

The integrated management device 100 calculates the bidding capacity and the basic value suitable for the calculated expected frequency regulation signal using an optimization method and sets the operational schedule (S305). Here, the operation schedule is set such that the large-capacity battery system controls the SOC of the battery within a range between $SOC_{lowerlimit}$ and $SOC_{upperlimit}$, and is operated by bidding the bidding capacity and the basic value by which a maximum profit can be obtained.

Then, the integrated management device 100 bids the bidding capacity and the basic value of the operational schedule for the day-ahead market (S307).

If the bid for the day-ahead market is successful (S309), the large-capacity battery system receives an actual frequency regulation signal of the operation day and operates the large-capacity battery on the basis of the frequency regulation signal (S311 and S313). The integrated management device 100 stores the frequency regulation signal in the database and outputs power considering the bidding capacity and the basic value based on the actual frequency regulation signal.

If the SOC of the large-capacity battery is within a range between $SOC_{lowerlimit}$ and $SOC_{upperlimit}$, the large-capacity battery is operated using the bidding capacity and the basic value calculated in the day-ahead operation schedule (S317).

Otherwise, if the SOC of the large-capacity battery is not within a range between $SOC_{lowerlimit}$ and $SOC_{upperlimit}$, the bidding capacity and the basic value are recalculated and rebid (S319)

Figure 5:
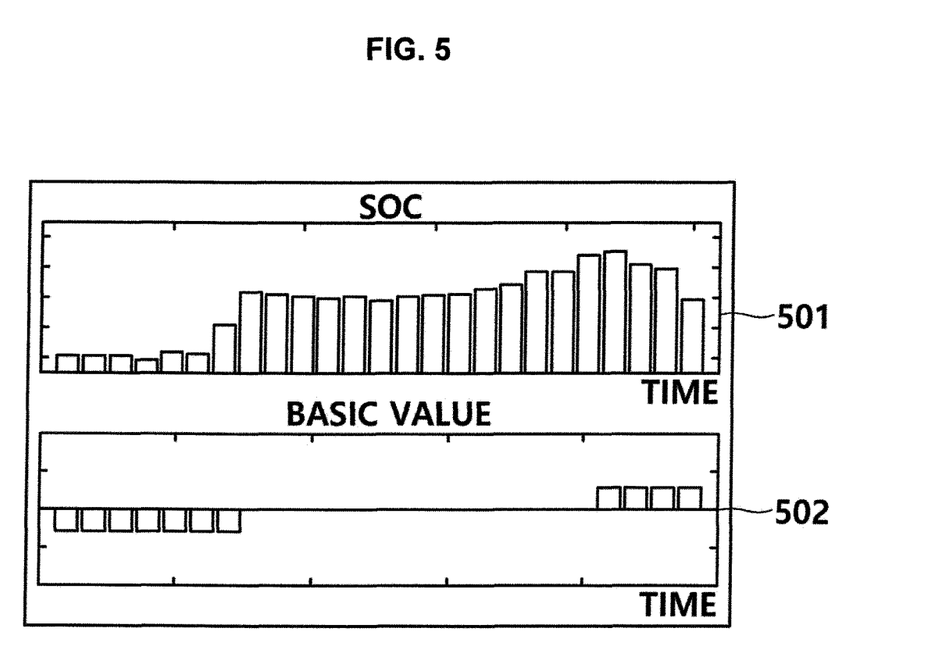
FIG. 5 is a schematic diagram illustrating an operational schedule determined by the large-capacity battery system according to an embodiment of the invention.

FIG. 5 is a schematic diagram illustrating the operational schedule determined by the large-capacity battery system according to an embodiment of the invention.

Referring to FIG. 5, a graph 501 shows the SOC estimated in the operational schedule of the large-capacity battery system on a time-zone basis, and a graph 502 shows the basic value on a time-zone basis.

In the SOC management of the large-capacity battery at the operation day, if the SOC of the large-capacity battery is lower than $SOC_{lowerlimit}$ or higher than $SOC_{upperlimit}$, the large-capacity battery system recalculates the bidding capacity and the basic value and rebids for the real-time market in order to recover the SOC of the large-capacity battery within the range between $SOC_{lowerlimit}$ and $SOC_{upperlimit}$ (S319).

When the bidding capacity and the basic value are changed, a ratio between the output power magnitude and the charge/discharge signal is changed, so that the SOC of the large-capacity battery can be charged or discharged. Therefore, it is possible to manage the SOC of the large-capacity battery within the range between $SOC_{lowerlimit}$ and $SOC_{upperlimit}$.

Figure 6:
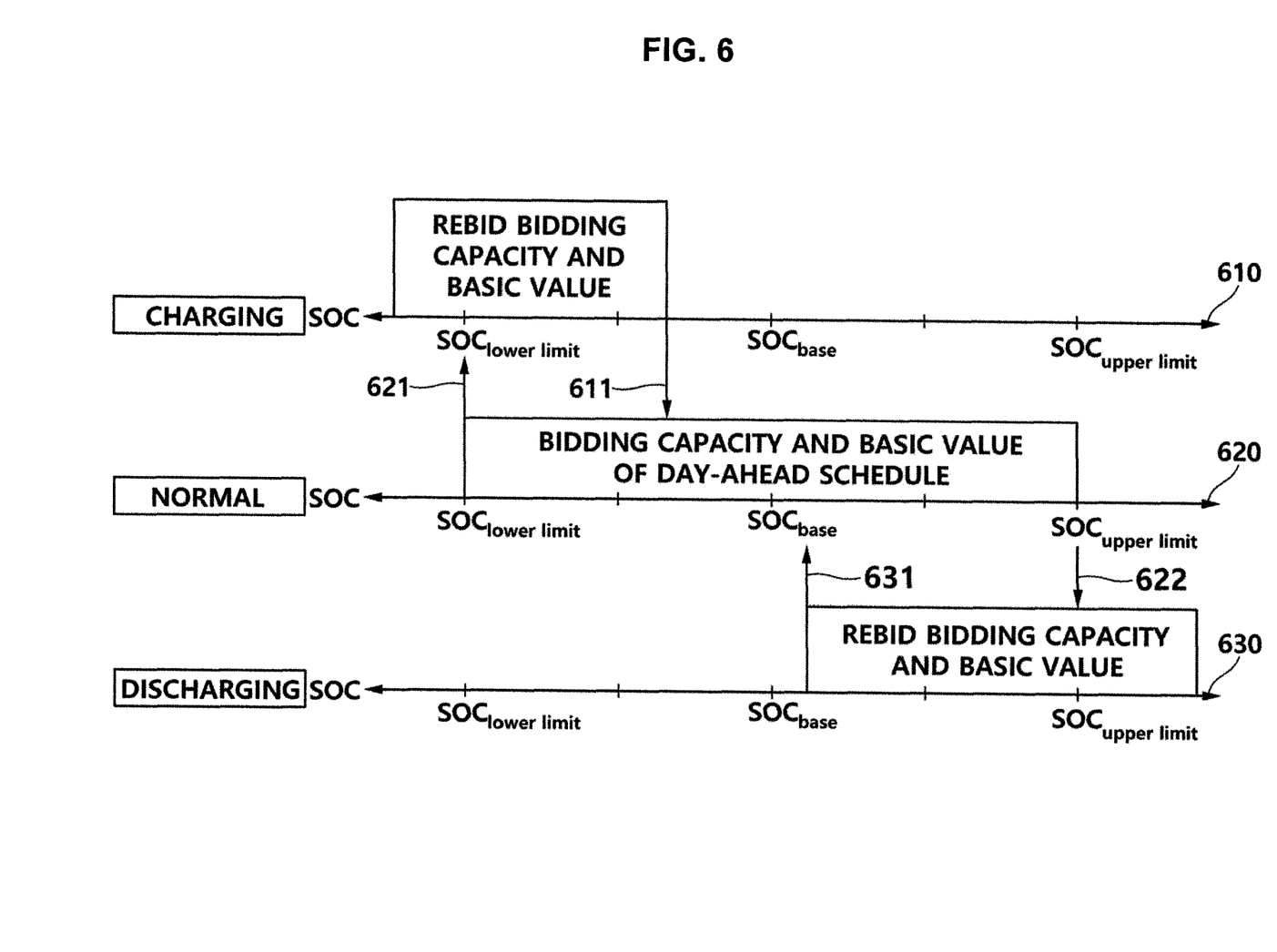
FIG. 6 is a schematic diagram illustrating a method of charging/discharging a large-capacity battery in the large-capacity battery system according to an embodiment of the invention.
Figure 7:
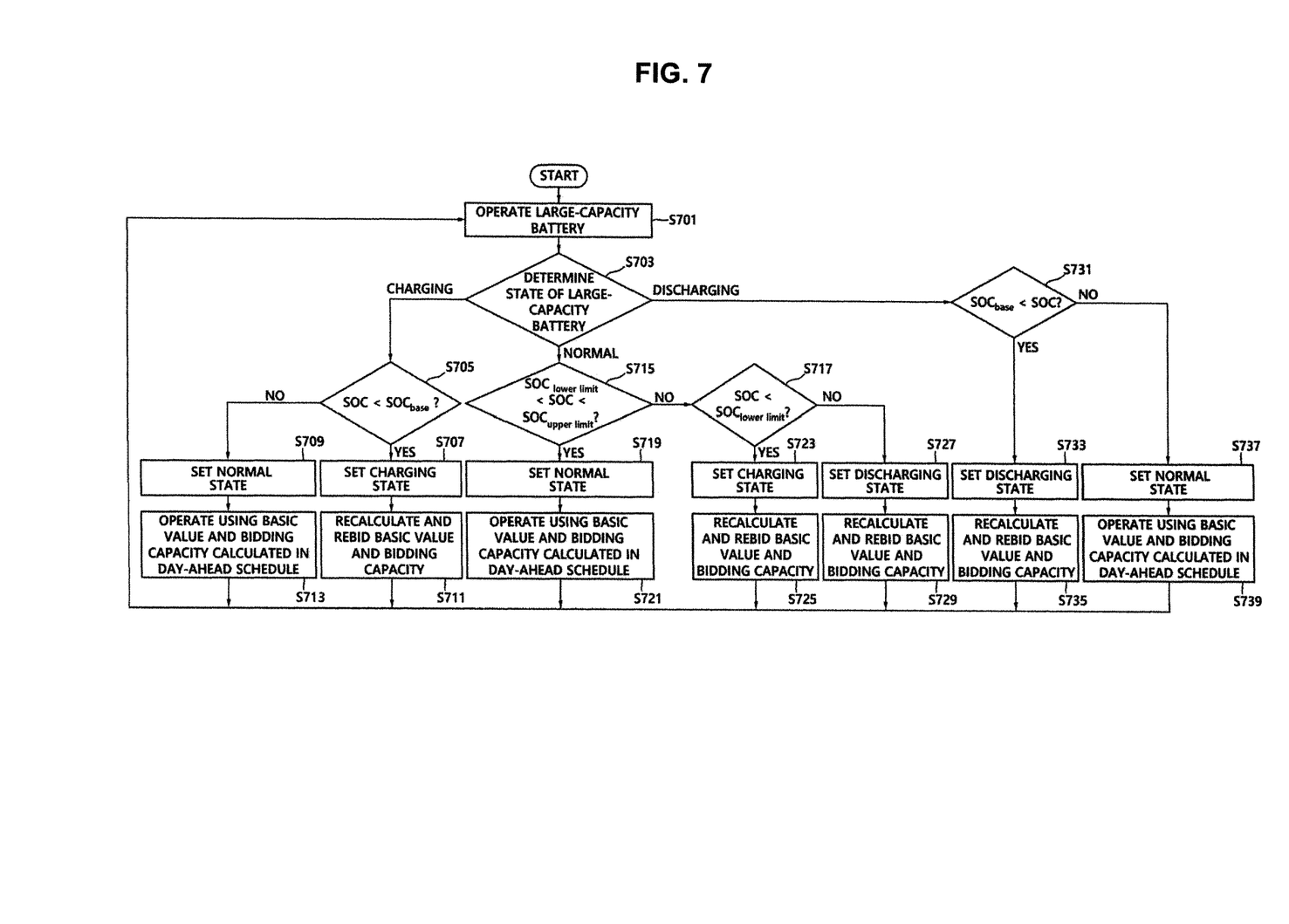
FIG. 7 is a flowchart illustrating a method of charging/discharging the large-capacity battery in the large-capacity battery system according to an embodiment of the invention.

FIG. 6 is a schematic diagram illustrating a method of charging/discharging the large-capacity battery in the large-capacity battery system according to an embodiment of the invention, and FIG. 7 is a flowchart illustrating a method of charging/discharging the large-capacity battery in the large-capacity battery system according to an embodiment of the invention.

FIGS. 6 and 7 illustrate a charging/discharging method for preventing the SOC from deviating from the SOC restriction range of the large-capacity battery when a difference between the expected frequency regulation signal calculated using the history of the frequency regulation signal and the actual frequency regulation signal increases in the operation of the large-capacity battery system of the operation day, and the SOC of the large-capacity battery decreases under $SOC_{lowerlimit}$ or increases over $SOC_{upperlimit}$.

Referring to FIG. 6, when the SOC of the battery is operated within a range between $SOC_{lowerlimit}$ and $SOC_{upperlimit}$ in the real-time operation of the large-capacity battery (620), the large-capacity battery system maintains the bidding capacity and the basic value applied to a bid for the day-ahead market without a separate control and is operated in a normal state.

In this case, if the SOC of the large-capacity battery decreases under $SOC_{lowerlimit}$ (621), the large-capacity battery system sets the charging state, changes the bidding capacity and the basic value for the charging, and rebids for the real-time market to operate the battery (610).

If the SOC of the large-capacity battery is charged up to $SOC_{base}$ set by the large-capacity battery system on the basis of the changed bidding capacity and the changed basic value (611), the large-capacity battery system sets the normal state again, and bids the bidding capacity and the basic value determined in the day-ahead operation schedule to operate the battery (620).

If the SOC of the large-capacity battery is higher than $SOC_{upperlimit}$ (622), the large-capacity battery system sets the discharging state, changes the bidding capacity and the basic value for the discharging, and rebids for the real-time market to operate the battery (630).

If the SOC of the large-capacity battery is discharged up to $SOC_{base}$ set by the large-capacity battery system on the basis of the changed bidding capacity and the changed basic value (631), the large-capacity battery system sets the normal state again, and bids the bidding capacity and the basic value determined in the day-ahead operation schedule to operate the battery (620).

Here, a rebidding pre-notification time in the rebidding of the basic value is changed depending on a rule of each frequency regulation market.

Referring to FIG. 7, in the operation of the large-capacity battery (S701), the large-capacity battery system determines a state of the large-capacity battery (S703).

If the large-capacity battery currently has the normal state, the normal state is maintained (S719) as long as a relationship $SOC_{lowerlimit}<SOC<SOC_{upperlimit}$ is maintained (S715). In addition, the large-capacity battery is operated using the basic value and the bidding capacity calculated in the day-ahead operation schedule (S721).

However, if the SOC deviates from the range $SOC_{lowerlimit}<SOC<SOC_{upperlimit}$ in step S715, and the SOC is lower than $SOC_{lowerlimit}$, the large-capacity battery system sets the charging state (S723), and recalculates and rebids the basic value and the bidding capacity (S725). If the SOC is higher than $SOC_{upperlimit}$, the large-capacity battery system sets the discharging state (S727), and recalculates and rebids the basic value and the bidding capacity (S729).

If the large-capacity battery currently has the charging state in step S703, and the SOC is lower than $SOC_{base}$ (S705), the basic value and the bidding capacity of the charging state are recalculated and rebid (S707 and S711).

If the SOC is charged up to $SOC_{base}$ in step S705, the large-capacity battery system sets the normal state (S709), and operates the large-capacity battery using the basic value and the bidding capacity calculated in the day-ahead operation schedule (S713).

If the large-capacity battery currently has the discharging state in step S703, and the SOC is higher than $SOC_{base}$ (S731), the basic value and the bidding capacity of the discharging state are recalculated and rebid (S733 and S735).

If the SOC is discharged up to $SOC_{base}$ in step S731, the large-capacity battery system sets the normal state (S737) and operates the large-capacity battery using the basic value and the bidding capacity calculated in the day-ahead operation schedule (S739).

While exemplary embodiments of the present invention have been shown and described hereinbefore, it will be apparent to those having ordinary skill in the art that a number of changes, modifications, or alterations to the invention as described herein may be made, none of which depart from the spirit of the present invention. All such changes, modifications and alterations should therefore be seen as within the scope of the present invention.

REFERENCE SIGNS AND NUMERALS 100 integrated management device
200 output control device

INDUSTRIAL APPLICABILITY

The present invention relates to a large-capacity battery system and a large-capacity battery operation method and can be applied to a field of the large-capacity battery.

The invention claimed is:

1. A method of operating a large-capacity battery in a large-capacity battery system for managing the large-capacity battery used in frequency regulation of a power grid system, the method comprising:
calculating an expected frequency regulation signal of a next day using history information on past frequency regulation signals;
calculating a bidding capacity and a basic value of the large-capacity battery suitable for the expected frequency regulation signal;
determining an operational schedule using the calculated bidding capacity and the calculated basic value;
bidding the bidding capacity and the basic value of the large-capacity battery for a day-ahead frequency regulation market on a basis of the operational schedule; and
receiving and storing the frequency regulation signal from a real-time frequency regulation market and operating the large-capacity battery on a basis of the received frequency regulation signal if the bidding of the bidding capacity and the basic value of the large-capacity battery for the day-ahead frequency regulation market is successful.

2. The method according to claim 1, wherein, if a state of charge (SOC) of the large-capacity battery is within a range between a lower-limit SOC and an upper-limit SOC set in advance in the method of operating the large-capacity battery, the large-capacity battery is operated using the bidding capacity and the basic value of the large-capacity battery calculated in a day-ahead operation schedule.

3. The method according to claim 2, wherein, if the SOC of the large-capacity battery is not within the range between the lower-limit SOC and the upper-limit SOC set in advance in the method of operating the large-capacity battery, the bidding capacity and the basic value of the large-capacity battery are recalculated and rebid for a real-time market.

4. The method according to claim 3, wherein, if the SOC of the large-capacity battery decreases under the lower-limit SOC, the large-capacity battery system sets a charging state for charging the large-capacity battery, recalculates the bidding capacity and the basic value for charging the large-capacity battery, and rebids for the real-time market.

5. The method according to claim 4, further comprising:
recalculating the bidding capacity and the basic value and rebidding for the real-time market to recover the SOC of the large-capacity battery until the SOC of the large-capacity battery in the charging state becomes a basic SOC set in advance; and
returning to a normal state again and operating the large-capacity battery using the bidding capacity and the basic value of the large-capacity battery calculated in the day-ahead operation schedule if the SOC of the large-capacity battery is higher than the basic SOC.

6. The method according to claim 5, wherein, if the SOC of the large-capacity battery increases over the upper-limit SOC, the large-capacity battery system sets a discharging state for discharging the large-capacity battery, recalculates the bidding capacity and the basic value for discharging the large-capacity battery, and rebids for the real-time market.

7. The method according to claim 6, further comprising:
recalculating the bidding capacity and the basic value and rebidding for the real-time market to recover the SOC of the large-capacity battery until the SOC of the large-capacity battery of the discharging state becomes equal to the basic SOC; and
returning to the normal state again and operating the large-capacity battery using the bidding capacity and the basic value of the large-capacity battery calculated in the day-ahead operation schedule if the SOC of the large-capacity battery becomes lower than the basic SOC.

8. The method according to claim 3, wherein a rebidding pre-notification time changes on a basis of a rule defined in each frequency regulation market when the bidding capacity and the basic value of the large-capacity battery are recalculated and are rebid for the real-time market.

9. The method according to claim 1, wherein the bidding capacity and the basic value are calculated using an optimization method when the bidding capacity and the basic value of the large-capacity battery suitable for the expected frequency regulation signal are calculated.

10. A large-capacity battery system for managing a large-capacity battery used in frequency regulation of a power grid system, comprising:
an output control device provided with the large-capacity battery which is an energy storage system (ESS) and configured to manage output power of the large-capacity battery; and
an integrated management device configured to manage the output control device,
receive an actual frequency regulation signal from a frequency regulation market,
store a history of the frequency regulation signal, calculate an expected frequency regulation signal of a next day using history information on a past frequency regulation signal, calculate a bidding capacity and a basic value of the large-capacity battery suitable for the expected frequency regulation signal, determine an operational schedule using the calculated bidding capacity and the calculated basic value, bid the bidding capacity and the basic value of the large-capacity battery for a day-ahead frequency regulation market on a basis of the operational schedule, receive and store a frequency regulation signal from a real-time frequency regulation market if the bidding of the bidding capacity and the basic value of the large-capacity battery for the day-ahead frequency regulation market is successful, and operate the large-capacity battery on a basis of the received frequency regulation signal.

11. The large-capacity battery operation system according to claim 10, wherein the integrated management device operates the large-capacity battery using the bidding capacity and the basic value of the large-capacity battery calculated in the day-ahead operation schedule if a state of charge (SOC) of the large-capacity battery is within a range between a lower-limit SOC and an upper-limit SOC set in advance.

12. The large-capacity battery operation system according to claim 11, wherein the integrated management device recalculates the bidding capacity and the basic value of the large-capacity battery and rebids for a real-time market if the SOC of the large-capacity battery is not within the range between the lower-limit SOC and the upper-limit SOC set in advance.

13. The large-capacity battery operation system according to claim 12, wherein the integrated management device sets a charging state for charging the large-capacity battery, recalculates the bidding capacity and the basic value for charging the large-capacity battery, and rebids for the real-time market if the SOC of the large-capacity battery decreases under the lower-limit SOC.

14. The large-capacity battery operation system according to claim 13, wherein the integrated management device recalculates the bidding capacity and the basic value and rebids for the real-time market to recover the SOC of the large-capacity battery until the SOC of the large-capacity battery of the charging state becomes a basic SOC set in advance, and the integrated management device returns to a normal state again and operates the large-capacity battery using the bidding capacity and the basic value of the large-capacity battery calculated in a day-ahead operational schedule if the SOC of the large-capacity battery is higher than the basic SOC.

15. The large-capacity battery operation system according to claim 14, wherein the integrated management device sets a discharging state for discharging the large-capacity battery, recalculates the bidding capacity and the basic value for discharging the large-capacity battery, and rebids for the real-time market if the SOC of the large-capacity battery increases over the upper-limit SOC.

16. The large-capacity battery operation system according to claim 15, wherein the integrated management device recalculates the bidding capacity and the basic value and rebids for the real-time market to recover the SOC of the large-capacity battery until the SOC of the large-capacity battery of the discharging state becomes the basic SOC, and the integrated management device returns to the normal state again and operates the large-capacity battery using the bidding capacity and the basic value of the large-capacity battery calculated in the day-ahead operation schedule if the SOC of the large-capacity battery is lower than the basic SOC.

17. The large-capacity battery operation system according to claim 10, wherein a rebidding pre-notification time changes on a basis of a rule defined for each frequency regulation market when the bidding capacity and the basic value of the large-capacity battery are recalculated and are rebid for the real-time market.

18. The large-capacity battery operation system according to claim 10, wherein the bidding capacity and the basic value are calculated using an optimization method.

19. The large-capacity battery operation system according to claim 10, wherein the integrated management device has a database for storing the frequency regulation signal received from the real-time frequency regulation market.

* * * * *